United States Patent
Bartels et al.

(10) Patent No.: US 6,263,480 B1
(45) Date of Patent: Jul. 17, 2001

(54) EFFICIENT TRACING OF SHORTS IN VERY LARGE NETS IN HIERARCHICAL DESIGNS

(75) Inventors: Ronald Allen Bartels, Bloomingburg; Ulrich Alfons Finkler, Montrose, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/238,420

(22) Filed: Jan. 28, 1999

Related U.S. Application Data

(60) Provisional application No. 60/114,476, filed on Dec. 30, 1998.

(51) Int. Cl.⁷ .................................................... G06F 17/50
(52) U.S. Cl. ................................................................ 716/13
(58) Field of Search ..................................... 716/5, 12, 13

(56) References Cited

U.S. PATENT DOCUMENTS

| | | | |
|---|---|---|---|
| 4,484,292 | * 11/1984 | Hong et al. | 716/13 |
| 4,615,011 | * 9/1986 | Linsker | 716/13 |
| 4,852,016 | * 7/1989 | McGehee | 716/12 |

* cited by examiner

*Primary Examiner*—Trong Phan
(74) *Attorney, Agent, or Firm*—McGuireWoods, LLP; Paul J. Otterstedt

(57) ABSTRACT

Tracing a short as a shortest path of explicit Very Large Scale Integrated (VLSI) circuit design component instances between two VLSI design component instances with different net names in a hierarchical design is a non-hierarchical problem. The method described in this document computes an approximation for the shortest path of VLSI design component instances taking full advantage of the hierarchical structure of the design. For the resulting path it is guaranteed that it contains at least one of the VLSI design component instances that cause the short. For each individual cell a Shortest Path Search (SPS) can be applied. In comparison to prior flat searches, which required unfeasible amounts of storage and computation time on large nets, this solution requires asymptotically not more storage and computation time than other forms of hierarchical VLSI checking tasks.

5 Claims, 4 Drawing Sheets

US 6,263,480 B1

EFFICIENT TRACING OF SHORTS IN VERY LARGE NETS IN HIERARCHICAL DESIGNS

CROSS-REFERENCE TO RELATED APPLICATIONS

This application is a continuation-in-part of provisional patent application Serial No. 60/114,476 filed Dec. 30, 1998. This application is also related in subject matter to concurrently filed application Ser. No. 09/239,421, entitled "Efficient Tracing of Shorts in Very Large Nets in Hierarchical Designs Using Breadth First Search With Optimal Pruning," filed by U. Finkler and R. Bartels and assigned to a common assignee (IBM Docket YO9-98-447), the subject matter of which is incorporated herein by reference.

BACKGROUND OF THE INVENTION

1. Field of the Invention

The present invention generally relates to tracing of shorts in very large nets in Very Large Semiconductor Integrated (VLSI) circuit designs and, more particularly, to efficiently finding one electrical path containing at least one of the VLSI design component instances causing the short. In this task, the invention relaxes the requirement of a shortest path to an approximation of a shortest path to take full advantage of the hierarchical structure of the VLSI design.

2. Background Description

The problem of tracing shorts in a design is to find an electrical path consisting out of a small number of VLSI design component instances, such that it contains at least one of the VLSI design component instances that cause the short. We refer to such a path in the following as a "shorting path". Shorts between large nets, e.g., between circuit ground (GND) and source voltage (VDD), occur frequently in designs. Although existing tools are able to detect the existence of a short in a hierarchical design, finding a shorting path in large designs is extremely time consuming. The automated tracing of shorts between very large nets by existing software tools typically fails due to extreme storage or computation time requirements.

The problem of finding a short electrical path between two VLSI design component instances with different net attributes can be mapped to finding a short path in a graph, in which the vertices correspond to VLSI design component instances and the edges correspond to VLSI direct electrical connectivity between the two adjacent vertices. Net attributes are names attached to at least one VLSI design component instance on a net, where a net is a set of VLSI design component instances which form a connected component with respect to a relation as for example intersection between the geometric shapes of which the VLSI design components are composed. Geometric shapes are the most elementary type of VLSI design components, which usually form the leaf components in the VLSI design hierarchy. In the following, we will refer to leaf components as "leafs". For detailed definitions of hierarchy, VLSI design components, nets, etc., see U.S. Pat. Nos. 5,519,628 and 5,481,473 and the reference materials, *Introduction to Algorithms*, by T. H. Corment, C. E. Leiserson, R. L. Rivest (MIT Press), hereafter referred to as "Algorithms", and *The LEDA Platform for Combinatorial and Geometric Computing*, by K. Mehlhorn, and S. Naher (Cambridge University Press), hereafter referred to as "*Geometric Computing*".

"*Algorithms*" shows that the single source shortest path problem can be solved with a Breadth First Search (BFS) in O(N) time in unweighted graphs, Dijkstra's algorithm solves it in weighted undirected graphs in O(N log N) time.

In a hierarchical design, any standard shortest path search (as BFS or Dijkstra's algorithm) cannot be applied directly without flattening the design, which results in un-processable amounts of data for large designs. The BFS and Dijkstra's algorithm requires at least two Boolean values (representable as two bits in a computer memory) per vertex, which indicate whether or not the vertex was unprocessed, touched or visited. A vertex is called visited if its outgoing edges were investigated during the algorithm. It is called touched if it was found by investigating an outgoing edge of another node. In the following, we will refer to the different flavors of shortest paths searches as "SPS". In a shortest path search in a hierarchical design, at least these Boolean variables must be stored for each instance of a leaf, i.e., flat, even when the design is not flattened before processing.

Since very large designs might contain hundreds of millions of shapes, even storing one bit per shape instance is extremely storage consuming, in addition to the indexing problem. Hence, techniques to store the state temporarily for a limited number of instances or techniques taking advantage of the hierarchical structure of the problem are necessary.

SUMMARY OF THE INVENTION

It is therefore an object of the invention to provide a method to trace shorts efficiently with respect to time and storage requirements in large hierarchical designs.

According to the present invention, full advantage is taken of the hierarchical character of the design. The input to the trace short process is a hierarchically represented connected component of a net known to contain a short; i.e., it contains at least two VLSI design component instances attributed with net names, whose net names are different. In the following, we use place holders "A" and "B" for their net names. A connected component of a net is a set of VLSI design components such that there is an electrical path between each pair of components in that set. Note that this does not require a direct contact between each pair. Note also that only a subset of the components are attributed due to the hierarchical structure. The connected component of the net containing the short, which consists of a set of VLSI component instances in conducting layers of the design, is mapped to a graph as described above. Weights are determined for the edges of the graph out of an approximation for the diameter of the two adjacent nodes (i.e., VLSI design objects). The approximation "deflattens" the problem of finding the short.

A starting component instance with the label "A" and additional "start object properties" is identified as the starting instance. A hierarchical SPS is performed until a path of leaf instances between two leaf instances with labels "A" and "B" is found. The output is an approximation for the shortest path from the starting leaf to the determined offending leaf. In the same fashion as hierarchical layout verifications, this method takes advantage of the multiple use of identical sub-circuits by investigating such circuits only once in comparison to investigating each instance (i.e., each copy).

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
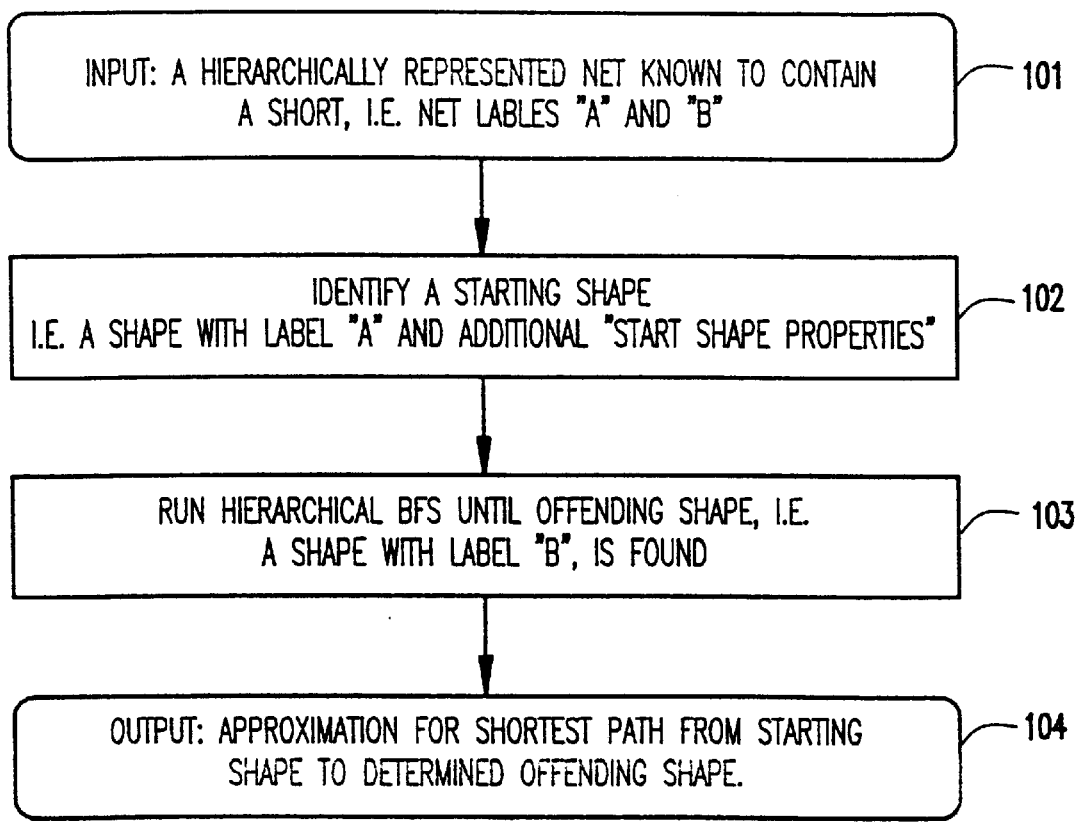
FIG. 1 is a flow chart of the hierarchical trace short process according to the invention.

Referring now to the drawings, and more particularly to FIG. 1, there is shown the process of tracing shorts hierarchically. The input 101 to the trace short process is a hierarchically represented connected component of a net known to contain a short; i.e., it contains at least two VLSI component instances attributed with net names, whose net names are different. In the following, we use the place holders "A" and "B" for these net names. Note that only a subset of components in the net are attributed with net names due to the hierarchical structure of the design. This net, which consists of a set of VLSI design component instances in conducting layers of the design, is mapped to the graph described above.

In function block 102, a starting VLSI design component instance is identified with label "A" in the cell in which the short is detected. Note that this is the lowest level of hierarchy in which the short exists. This starting instance has to be a part of the connected component that contains the short. A connected component of a net is a set of VLSI design components such that there exists an electrical connection between any pair of objects within this set.

A hierarchical SPS is run in function block 103 until the offending instance; i.e., an instance of a component with label "B", is found. Within the recursive calls in the SPS, the found path is refined into a path out of leaf component instances. The output 104 is an approximation for the shortest path from the attributed leaf component instance within the starting component instance to an offending leaf component instance. This path has to contain at least one leaf instance causing a short, since it connects two instances with different net labels, i.e., two objects that should not be electrically connected. Depending on the chosen approximation, the circuit is mapped to a weighted or unweighted graph, which dictates the choice of the SPS algorithm.

In U.S. Pat. Nos. 5,519,628 and 5,481,473, hierarchical tracing of shorts is based on the hierarchical representation of the layout. In the flattened layout, the nets can be mapped to graphs in which the leaf component instances are the nodes and the edges are electrical connections between the leaf objects.

Figure 2:
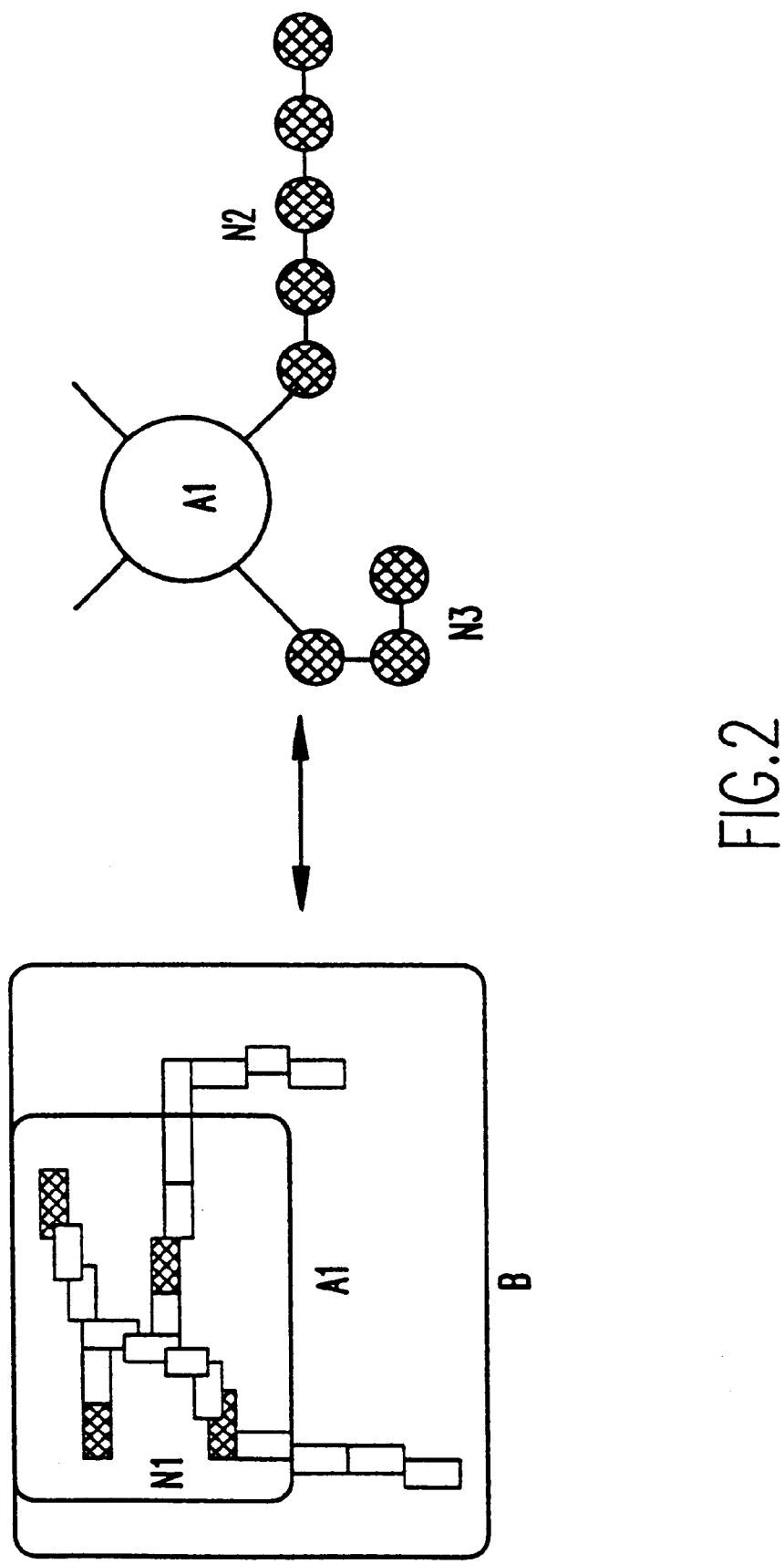
FIG. 2 shows an example of a composition of a net out of leaf objects and net instances.

In the hierarchical representation of the layout, a net A in a cell C is composed out of instances of nets and instances of leaf components, which are, in general, native shapes. A native shape in a cell C is a shape that is defined in the cell C. FIG. 2 shows an example in which cell A containing a net $N_1$ is instantiated as $A_1$ in a cell B with a net $N_2$, such that the two nets are connected. Thus, in the example, the complete flattened net consists out of the leaf objects of $N_2$ and of one instance of the set of leaf objects $N_1$. The right hand side of FIG. 2 shows the hierarchical graph representation, while the left hand side shows the flat representation in terms of leaf objects (here shown as rectangles). The shapes contained in the inner frame labeled with $A_1$ belong to $N_1$. Several copies of A may be placed inside of another cell, each such copy is called an "instance" of A. Note that if A contains several nets, it is not necessary that they all belong to the same flat net B.

For the hierarchical SPS, the instance of a net in a cell A is represented as a (weighted) graph, in which leaf objects and instances of nets are nodes and electrical connections between those are the edges. Each edge (i,j) carries a weight $W_{ij}$:

$$W_{ij} = \frac{2 + d(i) + d(j)}{2},$$

where d(i) is an approximation for the diameter of the node. If the node i is a leaf component instance, d(i)=0; otherwise, it is an approximation for the diameter of the graph induced by the net the node represents an instance of. The definition applies recursively. Depending on the accuracy of the desired result, different approximations for the diameter are possible from an estimate based on the number of nodes and edges in the flattened cell up to computing the exact path length of the path for a given pair of contacting nodes. If the diameter of each instance is neglected, we obtain an unweighted graph. Particularly interesting approximations for the diameter are based on even distributions of edges in planar graphs or graphs of bounded thickness, since electrical nets in VLSI design are either planar or routed on a limited number of metal layers.

The algorithm for hierarchical Shortest Path Search (SPS) works as follows:

1. The algorithm starts with one attributed starting component instance (attribute "A") in the cell $C_0$ in which the short was detected by the continuity check. The connected component of net $N_0$ containing this leaf forms a graph $G_0$.

2. A shortest path search (Dijkstra's algorithm in the weighted case or BFS in the unweighted case) is started in $G_0$. The adjacency of an edge in this graph represents one side of an electrical connection, either to a leaf component instance or to an instance of a subnet.

3. For each node i on the path in $G_i$ which is not a leaf object, a shortest path search is started recursively. Let $G_j$ be the graph (i.e., subnet) represented by node i in $G_i$. The edge adjacent to i in $G_i$ represents an intersection between an object in $G_j$ and an object in $G_i$. The starting object for the recursive call in $G_j$ is j. There are two cases:

(a) The node i was the beginning or the end of the determined path in $G_i$. In this case the SPS algorithm searches for an attributed node (i.e. net or leaf object) with the attribute of "A" or "B", respectively.

(b) The node i was on the path in $G_i$, but not an end node. In this case it has a second neighbor in the path in $G_i$. This neighbor intersects with an object k in $G_j$. The SPS algorithm searches for k.

This is applied recursively until for each node not representing a leaf object the path is found.

4. The resulting flat path obtained by flattening the hierarchical path in the recursion (all nodes are now leaf objects) is returned.

If the flat numbers of nodes and edges are propagated upwards in the hierarchy during the net build process, an estimate for the diameter of each hierarchical subgraph can be computed within constant time as mentioned above. The algorithm takes at most $$O\left(\sum_{C_i} |C_i| \log(|C_i|)\right)$$

steps where $|C_i|$ is the number of edges in the subnet $C_i$ and the sum covers all subnet instances visited during the recursive application of Dijkstra's algorithm. If several instances of the same subnet are entered at a pair of nodes for which the shortest path is already known, the previously computed hierarchical path can be reused. In any case, the shortest path search is only performed in subnets which contain part of the resulting flat path.

Figure 3A:
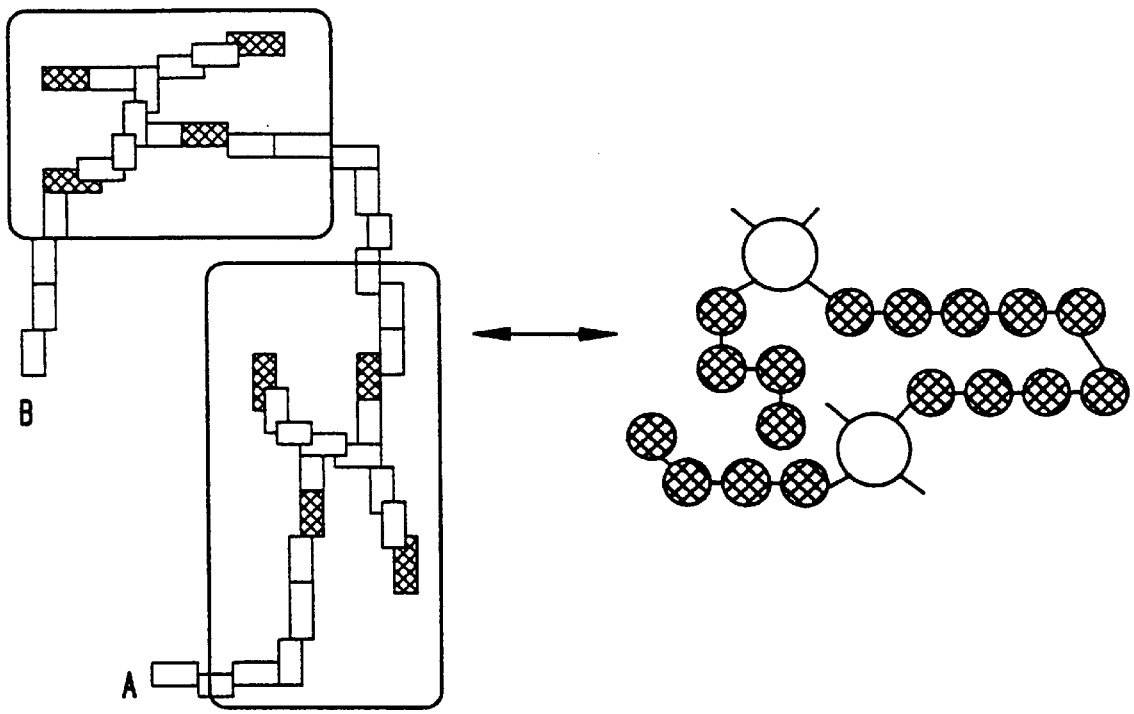
FIGS. 3A and 3B show an example of the flat representation of a net with two levels of hierarchy, along with their corresponding flat graphs of the leaf component instances, FIG. 3B showing the definition of the cell which is instantiated twice in FIG. 3A for a hierarchal cell design.
Figure 3B:
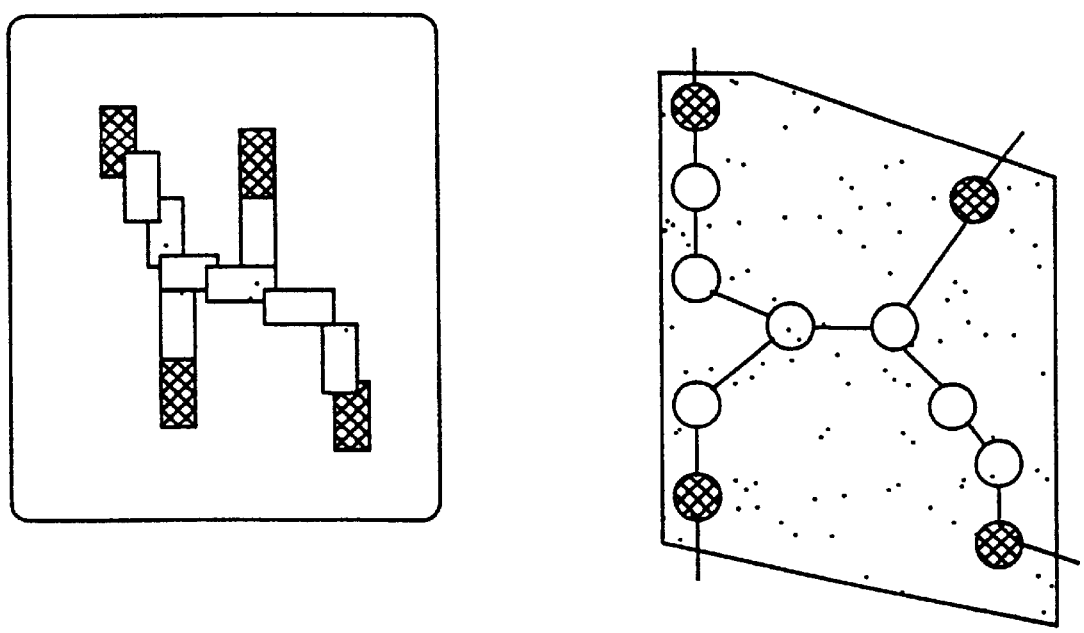

FIGS. 3A and 3B show an example of a path on two levels of hierarchy. FIG. 3A shows the flat view of the whole net with shapes labeled with A and B and the representing graph for this structure. The darker shapes in FIGS. 3A and 3B denote ports; i.e., shapes which may be intersecting with components outside of the cell. The two nodes representing the instances (the large nodes) have, in this example, an average diameter of $\overline{5.6}$ (where the overbar indicates a rounding off approximation and the unit of measurement is the number of intersections between shapes on the path). FIG. 3B shows the cell which is instantiated twice and the equivalent graph. In this small example, there is only one possible path in the prime cell.

Figure 4:
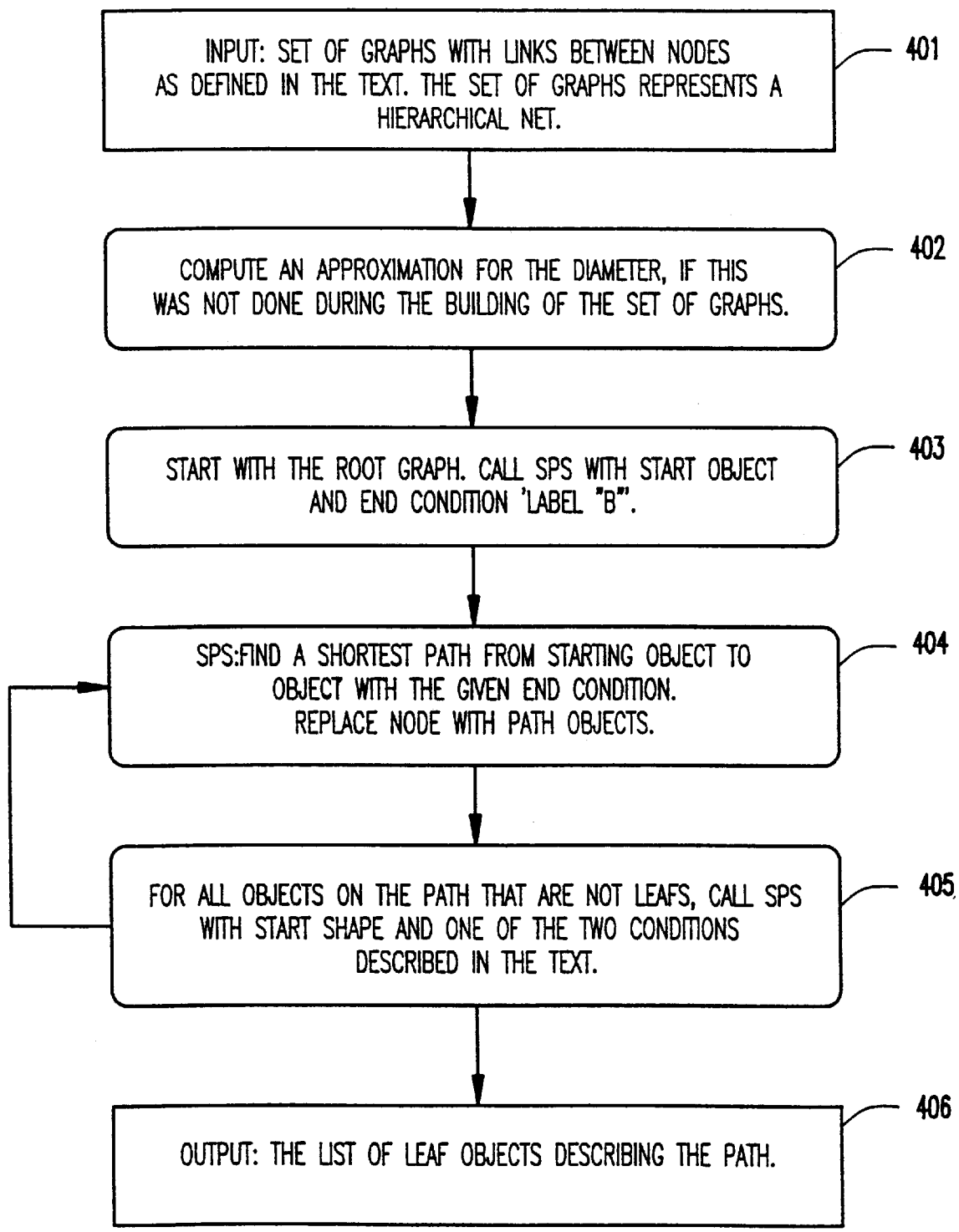
FIG. 4 is a flow chart showing the logic of a specific implementation of the invention.

FIG. 4 is a flow diagram showing the logic of the hierarchical shortest path search according to the present invention. The implementation requires a data structure representing undirected graphs. Various implementations can be found in the computer science literature or are available in class libraries, see "Geometric Computing." Each connected component of a subnet is mapped into this graph representation as described above. Every edge e has two adjacent nodes a and b. Without loss of generality, we choose a for the following description. If a does not represent a leaf component, it stores a pointer to the subgraph $G_a$ it represents. Additionally, e stores a pointer to a node x within the subgraph $G_a$ to find the start and end points for the recursive calls. Note that electrical connections are physically occurring only between leaf component instances, passing several levels of hierarchy in the hierarchical representation. If by convention x contains the leaf component instance one level lower than a in the hierarchy that is responsible for the electrical connection represented by e, then pseudonodes which are not representing a subnet or a leaf component instance have to be inserted in places in which an intrusion between two objects crossed more than two levels of hierarchy. Through this convention, we guarantee that the interaction described by an edge does not cross more than one level of hierarchy. Together with every graph and every leaf object which carries an attribute (net name), the net name is stored. The described structure is the input 401 to the hierarchical shortest path search. In block 402, the approximation for the average diameter is computed for each node that is not a leaf node, if this was not already performed during the netbuild process.

FIG. 4 is a flow diagram showing the logic of the hierarchical shortest path search according to the present invention. The implementation requires a data structure representing undirected graphs. Various implementations can be found in the computer science literature or are available in class libraries (e.g., "Geometry"). Each connected component of a subnet is mapped into this graph representation as described above. Every edge e has two adjacent nodes a and b. Without loss of generality, we choose a for the following description. If a does not represent a leaf component, it stores a pointer to the subgraph $G_a$ it represents. Additionally, e stores a pointer to a node x within the subgraph $G_a$ to find the start and end points for the recursive calls. Note that electrical connections are physically occurring only between leaf component instances, passing several levels of hierarchy in the hierarchical representation. If by convention x contains the component instance one level lower than a in the hierarchy that is responsible for the electrical connection represented by e, then pseudo-nodes which are not representing a subnet or a leaf component instance have to be inserted in places in which an intrusion between two objects crossed more than two levels of hierarchy. Through this convention, we guarantee that the interaction described by an edge does not cross more than one level of hierarchy. Together with every graph and every leaf object which carries an attribute (net name), the net name is stored. The described structure is the input 401 to the hierarchical shortest path search. In block 402, the approximation for the average diameter is computed for each node that is not a leaf node, if this was not already performed during the netbuild process.

Blocks 404 and 405 show the recursion. The input to each recursive call is a start component instance and the criterion an end node of the desired shortest path has to satisfy as described above. The path, i.e., a sequence of leaf component instances, which is computed and refined during the process, is maintained in a doubly linked list. The recursion starts in block 403 with an empty list in the root graph. The shortest path search in the root fills the list with a path in which each node is a component instance in the root graph. Each following recursive call refines one node n on this path which is not a leaf component instance into a sequence of nodes representing a path in the subgraph $G_n$ corresponding to n as described above. The output in block 406 is the resulting path in which each node represents a leaf component instance.

While the invention has been described in terms of a single preferred embodiment, those skilled in the art will recognize that the invention can be practiced with modification within the spirit and scope of the appended claims.

Having thus described our invention, what we claim as new and desire to secure by letters patent is as follows:

1. A method of tracing a short as a path of explicit Very Large Scale Integrated (VLSI) circuit design component instances between two VLSI circuit design component instances with different net names in a hierarchical design comprising the steps of:

computing an approximation for a shortest path of VLSI design component instances taking advantage of the hierarchical structure of the circuit design; and conducting a Shortest Path Search (SPS) for each individual cell of the net to find an approximation for a shortest path from a starting shape to a determined offending shape.

2. The method according to claim 1 wherein the SPS is based on weights of the edges which are obtained by approximating the diameters of nodes of the net.

3. The method according to claim 1, further comprising the steps of:

mapping the problem of tracing shorts in a hierarchical representation of the net to a problem of on a set of weighted graphs and links; and identifying a starting shape in a hierarchically represented net known to contain a short.

4. The method according to claim 3, further comprising the step of deflattening the problem by approximation of diameters of graphs representing subnets in the hierarchical net representation such that the number of execution steps is based on the size of the hierarchical net structure and not the size of the flat structure.

5. The method according to claim 4, wherein the step of deflattenening is performed by approximations obtained from statistical models on planar graphs and graphs with bounded thickness.

* * * * *